United States Patent [19]
Klein et al.

[11] Patent Number: 5,656,844
[45] Date of Patent: Aug. 12, 1997

[54] SEMICONDUCTOR-ON-INSULATOR TRANSISTOR HAVING A DOPING PROFILE FOR FULLY-DEPLETED OPERATION

[75] Inventors: Kevin M. Klein, Tempe; Wen-Ling M. Huang; Jun Ma, both of Phoenix, all of Ariz.

[73] Assignee: Motorola, Inc., Schaumburg, Ill.

[21] Appl. No.: 507,898

[22] Filed: Jul. 27, 1995

[51] Int. Cl.$^6$ .......................... H01L 27/01; H01L 27/12; H01L 29/76

[52] U.S. Cl. .......................... 257/347; 257/66; 257/353

[58] Field of Search .................. 257/57, 66, 347, 257/350, 351, 353

[56] References Cited

FOREIGN PATENT DOCUMENTS

| | | | |
|---|---|---|---|
| 1-89164 | 4/1989 | Japan | 257/347 |
| 1-295464 | 11/1989 | Japan | 257/353 |
| 1-307268 | 12/1989 | Japan | 257/347 |

*Primary Examiner*—Steven H. Loke
*Attorney, Agent, or Firm*—Bruce T. Neel

[57] ABSTRACT

A semiconductor-on-insulator transistor (10) has a channel region (30) in a semiconductor film (16) under a gate insulating layer (26). The channel region has a top dopant concentration $N_T$ at a top surface (32) of the film that is significantly greater than a bottom dopant concentration $N_B$ at a bottom surface (34) of the film. This non-uniform doping profile provides an SOI device that operates in a fully-depleted mode, yet permits thicker films without a significant degradation of sub-threshold slope.

24 Claims, 2 Drawing Sheets

SEMICONDUCTOR-ON-INSULATOR TRANSISTOR HAVING A DOPING PROFILE FOR FULLY-DEPLETED OPERATION

BACKGROUND OF THE INVENTION

The present invention relates, in general, to semiconductor devices and, more particularly, to semiconductor-on-insulator devices operating in a fully-depleted mode.

Semiconductor-on-insulator (SOI) devices are typically formed using silicon and generally operate in either a partially-depleted mode or a fully-depleted mode. SOI devices operating in a fully-depleted mode exhibit very low sub-threshold slope and do not suffer from the so-called kink effect, however, such devices have a large threshold voltage sensitivity to the thickness of the thin-silicon film used for manufacture (for example, this sensitivity is typically 100 mV/100 angstroms), and require thin silicon films having a thickness of about 800 angstroms. These two disadvantages are significant because such a thin silicon film is difficult to manufacture with uniformity. Thus, the large threshold voltage sensitivity leads to non-uniform threshold voltages for the manufactured devices.

In contrast to the fully-depleted mode, SOI devices operating in a partially-depleted mode have reduced threshold voltage sensitivity to the thickness of the thin silicon film and are easier to manufacture because the thickness of the thin film can be greater than that required for fully-depleted devices. However, partially-depleted devices exhibit the kink effect, which adversely affects their use in analog applications. They also exhibit a degradation of sub-threshold slope compared to devices operating in the fully-depleted mode. A degraded sub-threshold slope increases device leakage when the device is turned "off".

When SOI devices are used for low power integrated circuits, such as in cellular phones and pagers, it is desirable that the sub-threshold slope be very low to reduce standby power consumption. Accordingly, there is a need for an SOI device that operates in a fully-depleted mode, yet has reduced threshold voltage sensitivity to the silicon film thickness and that can be formed using silicon films having a thickness greater than that required for prior fully-depleted devices.

DETAILED DESCRIPTION OF THE DRAWINGS

Briefly stated, the present invention provides a semiconductor-on-insulator (SOI) transistor with a non-uniformly doped channel region. The non-uniformity of the channel doping profile provides a transistor that operates in a fully-depleted mode and has a reasonable threshold voltage, yet that can be formed using significantly thicker semiconductor films than with prior SOI devices. The transistor also has significantly reduced threshold voltage sensitivity to the thickness of the semiconductor film.

Figure 1:
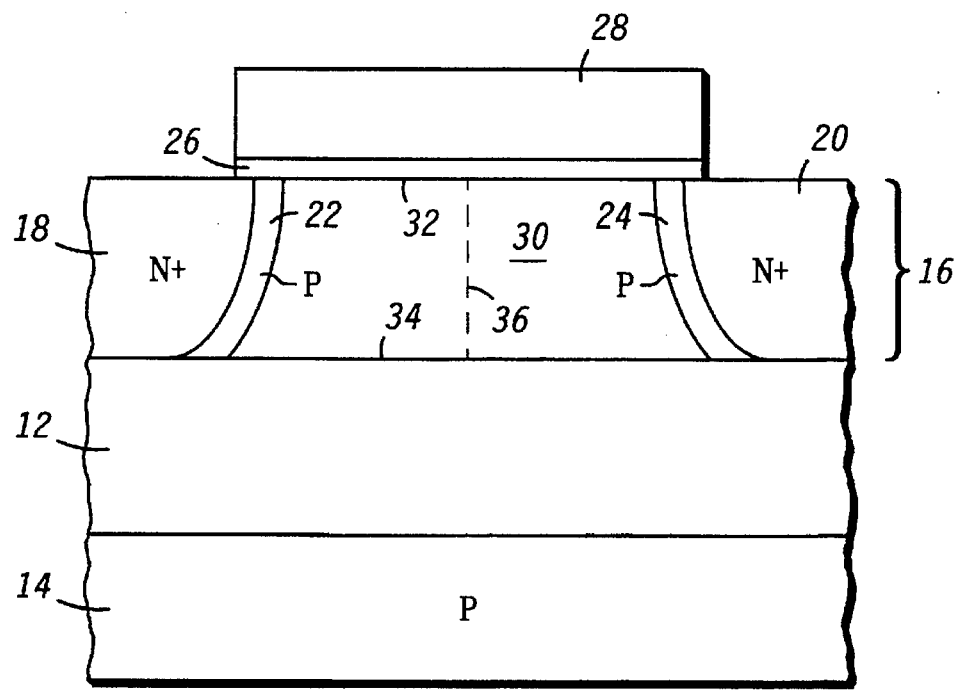
FIG. 1 is a cross-sectional view of a semiconductor-on-insulator transistor according to the present invention.

FIG. 1 illustrates a cross-section of a semiconductor-on-insulator transistor 10 according to the present invention. Transistor 10 is generally conventional in structure and has a buried insulating layer 12 on a semiconductor substrate 14. Substrate 14 is preferably silicon, and insulating layer 12 is, for example, silicon oxide having a thickness of about 2,000–10,000 angstroms. Sapphire can also be used for insulating layer 12.

A semiconductor film 16 of, for example, silicon has been formed on insulating layer 12 using well-known techniques. Film 16 is preferably silicon, and generally has a thickness of about 800–2,000 angstroms, and more preferably about 1,200–2,000 angstroms. Also, in some cases, film 16's thickness can be as low as about 500 angstroms. Although transistor 10 will be operated in a fully-depleted mode, it should be noted that the thickness of film 16 can be greater than the 800 angstroms thickness required by prior fully-depleted devices as discussed below.

A source region 18 and a drain region 20 have been formed in film 16 using conventional methods including, for example, heavy doping with an N-type dopant. Although an N-channel device is illustrated in FIG. 1 and described herein, one of skill in the art will recognize that the present invention can also be used with a P-channel device.

Halo regions 22 and 24 are also illustrated in FIG. 1, but are optional and preferably used to avoid the adverse short channel effects associated with drain-induced barrier lowering (DIBL). Halo regions 22 and 24 can be formed using well-known methods. As is known, halo regions 22 and 24 are doped with a dopant of an opposite conductivity type from that used to form source and drain regions 18 and 20.

A gate insulating layer 26 and a gate electrode layer 28 have been formed on film 16 using conventional techniques. Gate insulating layer 26 is preferably a silicon oxide layer having a thickness of, for example, about 50–150 angstroms, and gate electrode layer 28 is, for example, a polysilicon layer having a thickness of, for example, about 3,000 angstroms.

A channel region 30 underlies gate insulating layer 26 and is bounded by a top surface 32 and a bottom surface 34 of film 16. According to the present invention, channel region 30 has a non-uniform doping profile that provides a significant change in dopant concentration across channel region 30 from top surface 32 to bottom surface 34. More specifically, for the case of an N-channel device, channel region 30 is lightly P-doped so that the dopant concentration at top surface 32 is significantly greater than the dopant concentration at bottom surface 34. This non-uniform doping profile is in sharp contrast to the uniformly-doped thin films considered desirable for use in prior SOI devices.

Figure 2:
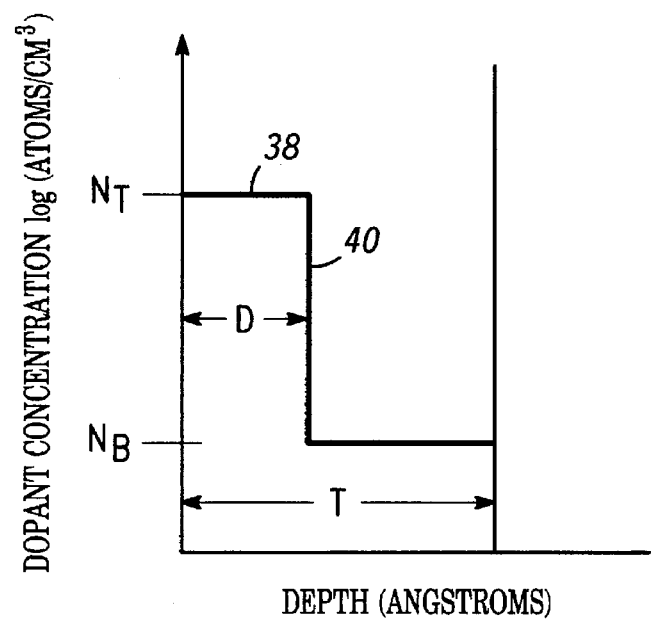
FIG. 2 is a graph illustrating dopant concentration versus depth for the channel region of the transistor of FIG. 1 according to a first embodiment of the present invention.

FIG. 2 illustrates an ideal doping profile for channel region 30 for a first embodiment of the present invention. Specifically, the logarithm of the dopant concentration in channel region 30 (log (atoms/cm$^3$)) is plotted versus the vertical depth into the channel region 30 from top surface 32 as indicated by dashed line 36 in FIG. 1. In FIG. 2 a step distribution 38 has an abrupt step 40 located a distance D vertically downward into channel region 30. The dopant concentration of channel region 30 at top surface 32 is indicated in FIG. 2 by $N_T$, and the dopant concentration at bottom surface 34 is indicated by $N_B$. The total thickness of channel region 30 is indicated by T.

For a doping ratio determined as $N_T/N_B$, the doping ratio is preferably greater than about 5, and more preferably between about 10 and 100. However, a doping ratio as low as about two or three is still believed to provide some benefits. Although specific ranges are given here, one of skill in the art will recognize that it is the non-uniformity of the doping profile in channel region 30 that provides the advantages discussed below. Most generally, the present invention includes any doping profile that is non-uniform and has $N_T > N_B$.

Step distribution 38 is a preferred, ideal distribution of dopant in channel region 30, and distribution 38 is preferably approximated to the extent practicable using conventional doping techniques and as limited by one's particular process integration. By way of example, shallow, direct ion implantation techniques well-known to those skilled in the art can be used to roughly approximate step distribution 38.

Figure 3:
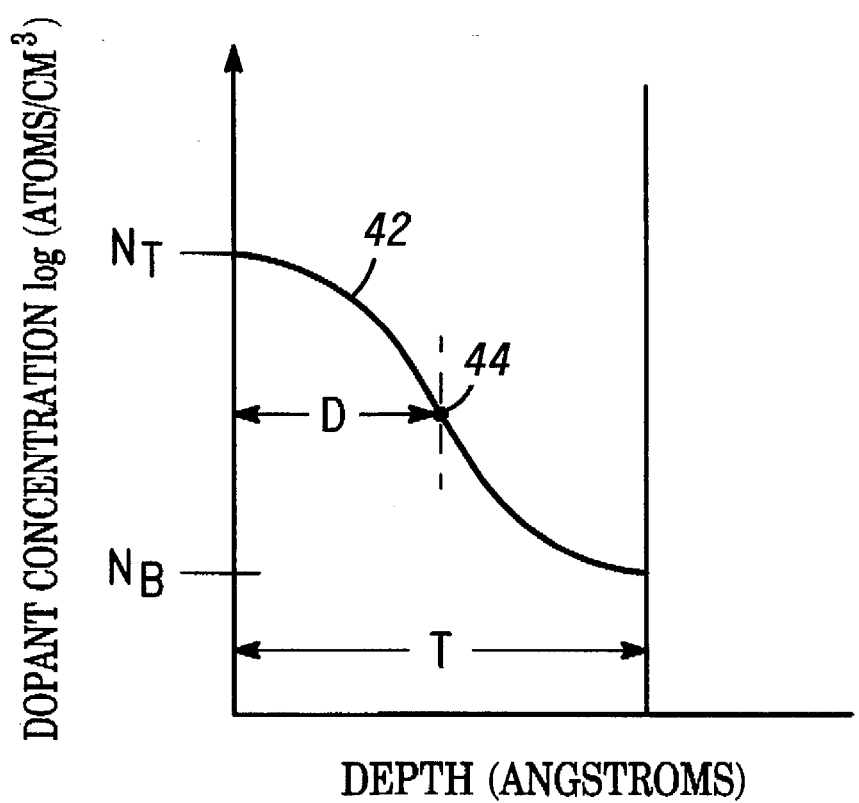
FIG. 3 is a graph illustrating dopant concentration versus depth for the channel region of the transistor of FIG. 1 according to a second embodiment.

FIG. 3 illustrates a doping profile for a second embodiment of the present invention corresponding to one particular doping technique. Specifically, as is known, a doped region formed by conventional ion implantation and annealing typically exhibits a gaussian-like distribution. In prior SOI devices the peak of the gaussian-like distribution is substantially centered in channel region 30 to provide a uniform profile. However, according to the present invention, a gaussian-like curve 42 is positioned so that the peak of the gaussian distribution corresponds substantially to $N_T$, and the tail of the distribution corresponds to $N_B$. As will be recognized by one of skill in the art, gaussian-like curve 42 can be positioned in this manner by ion implantation through device layers of an appropriate combined thickness that are overlying channel region 30 during the threshold voltage implantation step of the process sequence used to form transistor 10. These layers include, for example, gate insulating layer 26 and a precursor layer (not shown) to gate electrode layer 28 as discussed further below.

In FIG. 3, depth D roughly corresponds to a point 44 of a maximal slope of gaussian-like curve 42. For both FIGS. 2 and 3, the particular depth D selected for either step 40 or point 44 and dopant concentrations $N_T$ and $N_B$ are design choices that are selected as determined by the needs of a particular application, as is known to one of skill in the art.

As can be seen in FIGS. 2 and 3, channel region 30 typically has a doping profile that monotonically decreases from top surface 32 to bottom surface 34 of film 16. However, in some cases, the doping profile may not monotonically decrease as a result of the doping method used as discussed herein. Also, the particular depth D for step 40 or point 44 is not critical and is generally positioned, for example, about halfway between top surface 32 and bottom surface 34.

Typically, dopant concentration $N_T$ is selected to provide a threshold voltage for transistor 10 that is preferably greater than about 400 mV, but lower threshold voltages such as about 300 mV may be sufficient or desirable in certain applications. Generally, $N_T$ will be greater than about $8 \times 10^{16}$ atoms/cm$^3$. As a specific example, when approximating the step profile illustrated in FIG. 2 for a depth D of about 800 angstroms and a film 16 thickness of about 1,800 angstroms, $N_T$ is about $1.2 \times 10^{17}$ atoms/cm$^3$ to provide a threshold voltage of about 400 mV, and $N_B$ is about $1.2 \times 10^{16}$ atoms/cm$^3$ to provide fully-depleted operation. In this example, gate insulating layer 26 is silicon oxide with a thickness of about 105 angstroms, and gate electrode layer 28 is polysilicon with a thickness of about 3,000 angstroms.

As known to one of skill in the art, as the integrated dopant concentration in channel region 30 increases, the threshold voltage also increases. With prior devices, because a uniform channel dopant concentration is used for fully-depleted operation, any variance in the thickness T of semiconductor film 16 causes a significant change in the integrated dopant concentration and thus significantly changes the device's threshold voltage. However, according to the device of the present invention, the channel integrated dopant concentration is primarily controlled by dopant concentration $N_T$ at top surface 32 because dopant concentration $N_B$ at bottom surface 34 is made significantly less than $N_T$, as discussed above. Therefore, changes in film 16's thickness T, such as due to manufacturing variations across a processing wafer, will have a significantly reduced effect on the channel integrated dopant concentration and thus only a minor effect on the device's threshold voltage, even though channel region 30 remains fully-depleted.

Transistor 10 is generally manufactured using conventional techniques well-known to those of skill in the art. However, in one specific example, the doping of channel region 30 can be done by an ion implant through gate insulating layer 26 and gate electrode layer 28. Although gate electrode layer 28 has a preferred final thickness of about 3,000 angstroms, in order to achieve an appropriate depth D, an ion implant is performed at a point in the processing sequence at which gate electrode layer 28, which is a precursor layer of preferably polysilicon or amorphous silicon, has a thickness of about 500 angstroms and gate insulating layer 26, which is preferably silicon oxide, has a thickness of about 100 angstroms. For an N-channel device, boron is ion implanted at a dose of about $1.0–2.0 \times 10^{12}$ atoms/cm$^2$ and an energy of about 15–20 keV, and for a P-channel device, phosphorus is implanted at a dose of about $1.5–2.5 \times 10^{12}$ atoms/cm$^2$ and an energy of about 45–55 keV. Film 16 is preferably silicon having a thickness of about 1,500–2,000 angstroms.

In a later processing step, additional polysilicon is deposited on the precursor layer above to provide the final thickness of gate electrode layer 28. The remaining processing steps for transistor 10 are done using well-known methods. It should be noted that when optional halo regions 22 and 24 are used in transistor 10, they have a dopant concentration greater than dopant concentration $N_B$ of channel region 30.

In addition to the above, one of skill in the art will recognize that, depending on the particular process sequence integration selected for manufacture, the peak concentration of the doping profile in channel region 30 may be positioned somewhat below, rather than at, top surface 32. Also, in some cases, the minimum concentration of the doping profile will be slightly above bottom surface 34. Such profiles are still considered to be within the scope of the present invention. It is sufficient in such cases that the doping profile be significantly non-uniform substantially as described above. In particular, as discussed above, the ratio of such a peak concentration to a minimum concentration of a vertical doping profile for channel region 30 is also preferably about 5, and more preferably about 10–100, but some benefits are still observed where the ratio is only about two or three.

By now, it should be appreciated that there has been provided a novel structure for an SOI transistor. The significantly non-uniform doping profile of transistor 10 as discussed above satisfies the desire for the use a thicker silicon film while also retaining the advantages associated with a fully-depleted operation mode. The use of such a thicker film, for example, in bipolar-complementary metal oxide semiconductor (BiCMOS) applications allows more manufacturable base profiles and easier formation of emitter and collector contacts. Further, according to the present invention, the threshold voltage sensitivity to the silicon film thickness is dramatically reduced, and the fully-depleted operation eliminates the undesirable kink effect. Moreover, thicker semiconductor films can be used in a fully-depleted mode without a degradation of sub-threshold slope.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A semiconductor-on-insulator transistor, comprising:
   a semiconductor substrate;
   a buried insulating layer disposed on said semiconductor substrate;
   a semiconductor film, disposed on said buried insulating layer, having a top surface, a bottom surface in contact with said buried insulating layer, a source region, and a drain region;
   a gate insulating layer disposed on said top surface of said semiconductor film between said source region and said drain region;
   a gate electrode layer disposed on said gate insulating layer; and
   a channel region disposed in said semiconductor film between said source region and said drain region under said gate insulating layer and on said buried insulating layer, wherein when said transistor is in the off state said channel region has a top dopant concentration in a first portion closer to said top surface of said semiconductor film, said channel region has a bottom dopant concentration in a second portion further from said top surface of said semiconductor film, and said top dopant concentration is greater than said bottom dopant concentration.

2. The transistor of claim 1 wherein said semiconductor film has a thickness between about 500 and 2,000 angstroms.

3. The transistor of claim 1 wherein said channel region is fully depleted.

4. The transistor of claim 1 further comprising a halo region disposed between said drain region and said channel region wherein said halo region has a dopant concentration greater than said bottom dopant concentration of said channel region.

5. The transistor of claim 1 wherein a doping ratio determined as said top dopant concentration divided by said bottom dopant concentration is greater than about five.

6. The transistor of claim 5 wherein said doping ratio is between about 10 and 100.

7. The transistor of claim 1 wherein said channel region has a doping profile that monotonically decreases from said top surface to said bottom surface of said semiconductor film.

8. The transistor of claim 7 wherein said doping profile substantially corresponds to a gaussian curve.

9. The transistor of claim 7 wherein said doping profile substantially corresponds to a step distribution.

10. The transistor of claim 1 wherein a threshold voltage of said transistor is greater than about 300 mV.

11. The transistor of claim 10 wherein said top dopant concentration is greater than about $8-10^{16}$ atoms/cm$^3$.

12. The transistor of claim 11 wherein said gate electrode layer is polysilicon.

13. The transistor of claim 11 wherein said gate insulating layer has a thickness of about 50 to 150 angstroms.

14. A silicon-on-insulator transistor, comprising:
   a silicon substrate;
   a buried insulating layer disposed on said silicon substrate;
   a silicon film with a thickness greater than about 500 angstroms, disposed on said buried insulating layer, and having a top surface, a bottom surface in contact with said buried insulating layer, a source region, and a drain region;
   a gate oxide layer disposed on said top surface of said silicon film between said source region and said drain region;
   a gate electrode layer disposed on said gate oxide layer; and
   a channel region disposed in said silicon film between said source region and said drain region under said gate oxide layer and on said buried insulating layer, wherein when said transistor is in the off state said channel region has a top dopant concentration in a first portion closer to said top surface of said silicon film that is sufficiently high to set a threshold voltage of said transistor of at least about 400 mV, said channel region has a bottom dopant concentration in a second portion further from said top surface of said silicon film, and said top dopant concentration is greater than said bottom dopant concentration.

15. The transistor of claim 14 wherein said buried insulating layer is formed of a material selected from the group consisting of silicon oxide and sapphire.

16. The transistor of claim 14 wherein said channel region has a doping profile that monotonically decreases from said top surface to said bottom surface of said silicon film and a doping ratio determined as said top dopant concentration divided by said bottom dopant concentration is greater than about five.

17. The transistor of claim 16 wherein said top dopant concentration is greater than about $8 \times 10^{16}$ atoms/cm$^3$.

18. The transistor of claim 16 wherein said silicon film has a thickness between about 500 and 2,000 angstroms.

19. The transistor of claim 14 wherein said channel region is fully depleted.

20. A semiconductor-on-insulator transistor, comprising:
   a semiconductor substrate;
   a buried insulating layer disposed on said semiconductor substrate;
   a semiconductor film, disposed on said buried insulating layer, having a top surface, a bottom surface in contact with said buried insulating layer, a source region, and a drain region;
   a gate insulating layer disposed on said top surface of said semiconductor film between said source region and said drain region;
   a gate electrode layer disposed on said gate insulating layer; and
   a channel region disposed in said semiconductor film between said source region and said drain region under said gate insulating layer and on said buried insulating layer, wherein when said transistor is in the off state said channel region has a doping profile with a peak dopant concentration closer to said top surface of said semiconductor film and a minimum dopant concentration further from said top surface of said semiconductor film, and said peak dopant concentration is greater than said minimum dopant concentration.

21. The transistor of claim 20 wherein a doping ratio determined as said peak dopant concentration divided by said minimum dopant concentration is greater than about two.

22. The transistor of claim 21 wherein said doping ratio is greater than about five.

23. The transistor of claim 22 wherein a threshold voltage of said transistor is greater than about 300 mV.

24. The transistor of claim 23 wherein said semiconductor film has a thickness between about 500 and 2,000 angstroms.

* * * * *